United States Patent
Chan

(10) Patent No.: US 6,197,662 B1
(45) Date of Patent: *Mar. 6, 2001

(54) SEMICONDUCTOR PROCESSING METHOD OF FORMING FIELD ISOLATION OXIDE USING A POLYBUFFERED MASK WHICH INCLUDES A BASE NITRIDE LAYER ON THE SUBSTRATE, AND OTHER SEMICONDUCTOR PROCESSING METHODS

(75) Inventor: Hiang C. Chan, Freemont, CA (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/288,881

(22) Filed: Apr. 9, 1999

(Under 37 CFR 1.47)

Related U.S. Application Data

(63) Continuation of application No. 08/748,996, filed on Nov. 14, 1996, now Pat. No. 5,966,621.

(51) Int. Cl.[7] .......................... H01L 21/76; H01L 21/31; H01L 21/469
(52) U.S. Cl. .................. 438/439; 438/448; 438/775; 438/791
(58) Field of Search ............................ 438/439, 440, 438/448, 761, 775, 791

(56) References Cited

U.S. PATENT DOCUMENTS

| 4,764,248 | 8/1988 | Bhattacherjee et al. . |
| 5,049,517 | 9/1991 | Liu et al. . |
| 5,061,650 | 10/1991 | Dennison et al. . |
| 5,087,586 | 2/1992 | Chan et al. . |
| 5,159,428 | 10/1992 | Rao et al. . |
| 5,170,233 | 12/1992 | Liu et al. . |
| 5,236,856 | 8/1993 | Chan et al. . |
| 5,260,229 | 11/1993 | Hodges et al. . |

(List continued on next page.)

OTHER PUBLICATIONS

Molle et al., "Sealed Interface Local Oxidation by Rapid Thermal Nitridation"; pp. 3732–3738, The Electrochemical Society, Inc., vol. 1, No. 12, Dec. 1991.*

*Primary Examiner*—John F. Niebling
*Assistant Examiner*—Ron Pompey
(74) *Attorney, Agent, or Firm*—Wells, St. John, Roberts, Gregory & Matkin, P.S.

(57) ABSTRACT

A semiconductor processing method of forming field isolation oxide relative to a silicon substrate includes, i) rapid thermal nitridizing an exposed silicon substrate surface to form a base silicon nitride layer on the silicon substrate; ii) providing a silicon nitride masking layer over the nitride base layer, the base and masking silicon nitride layers comprising a composite of said layers of a combined thickness effective to restrict appreciable oxidation of silicon substrate thereunder when the substrate is exposed to LOCOS conditions; and iii) exposing the substrate to oxidizing conditions effective to form field isolation oxide on substrate areas not masked by the base and masking silicon nitride layers composite. Further, a semiconductor processing method of forming field isolation oxide relative to a semiconductor substrate includes, a) masking a first portion of a semiconductor substrate with a composite comprising a first nitride layer, a polysilicon layer over the nitride layer, and a second nitride layer over the polysilicon layer; and leaving a second portion of the semiconductor substrate unmasked by said composite; and b) exposing the semiconductor substrate to oxidizing conditions effective to form field isolation oxide in the second substrate portion.

27 Claims, 3 Drawing Sheets

U.S. PATENT DOCUMENTS

| | | |
|---|---|---|
| 5,273,924 | 12/1993 | Chan et al. . |
| 5,294,563 | 3/1994 | Rao . |
| 5,298,451 | 3/1994 | Rao . |
| 5,313,087 | 5/1994 | Chan et al. . |
| 5,358,894 | 10/1994 | Fazan et al. . |
| 5,369,051 | 11/1994 | Rao et al. . |
| 5,661,072 | 8/1997 | Jeng . |
| 5,714,414 | 2/1998 | Lee et al. . |
| 5,731,235 | 3/1998 | Srinivasan . |
| 5,798,296 | 8/1998 | Fazan et al. . |

\* cited by examiner

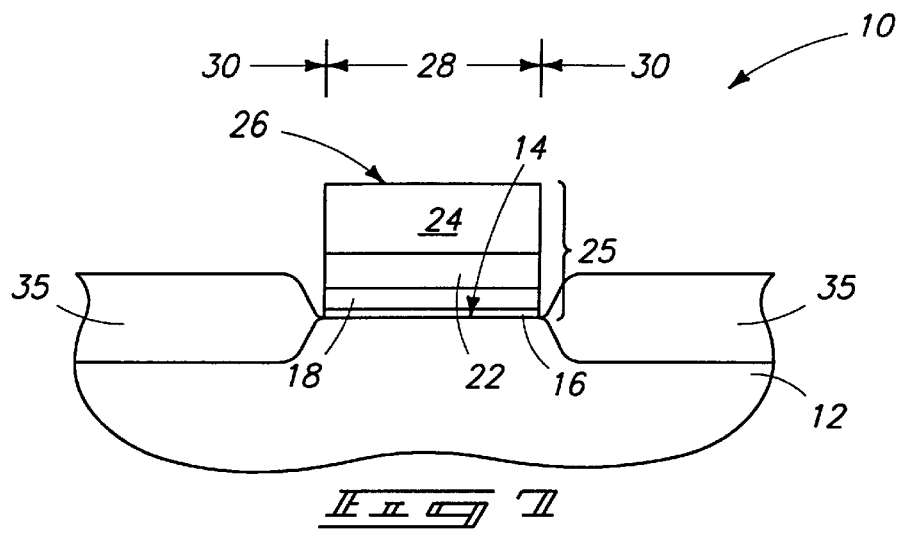
_Fig. 7_
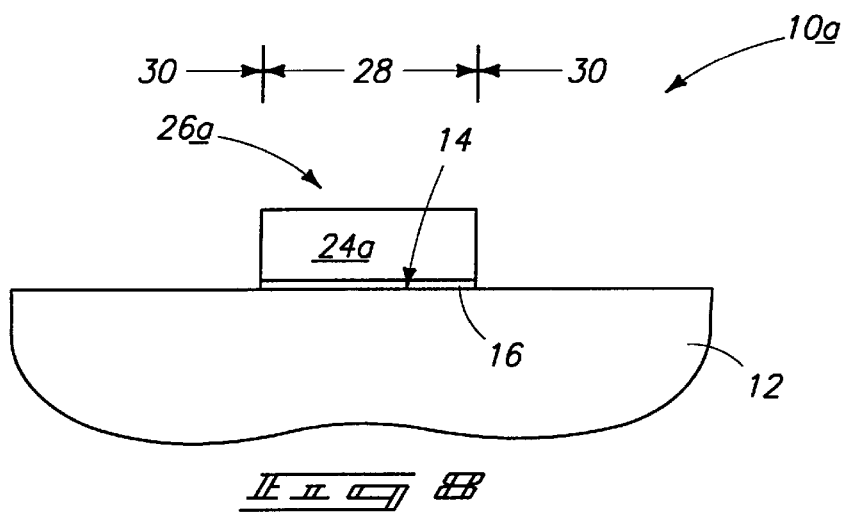
_Fig. 8_
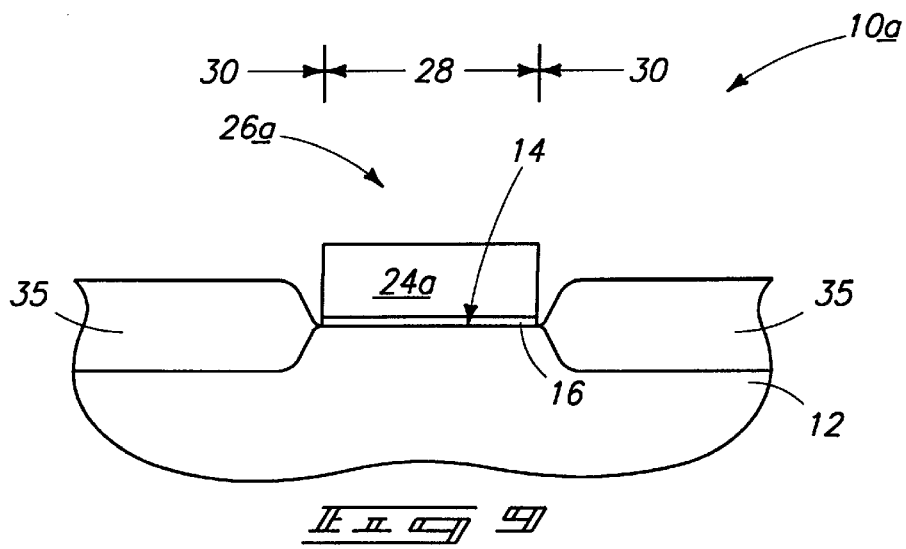
_Fig. 9_

SEMICONDUCTOR PROCESSING METHOD OF FORMING FIELD ISOLATION OXIDE USING A POLYBUFFERED MASK WHICH INCLUDES A BASE NITRIDE LAYER ON THE SUBSTRATE, AND OTHER SEMICONDUCTOR PROCESSING METHODS

RELATED PATENT DATA

This patent application is a continuation resulting from U.S. patent application Ser. No. 08/748,996, which was an application filed on Nov. 14, 1996 now U.S. Pat. No. 5,966,621.

TECHNICAL FIELD

This invention relates to semiconductor processing methods of forming field isolation oxide relative to a semiconductor substrate.

BACKGROUND OF THE INVENTION

The reduction in memory cell and other circuit size required for high density dynamic random access memories (DRAMs) and other circuitry is a continuing goal in semiconductor fabrication. Implementing electric circuits involves connecting isolated devices through specific electric paths. When fabricating silicon and other material into integrated circuits, it is necessary to isolate devices built into the substrate from one another. Electrical isolation of devices as circuit density increases is a continuing challenge.

One method of isolating devices involves the formation of a semi-recessed or fully recessed oxide in the nonactive (or field) area of the substrate. These regions are typically termed as "field oxide" and are formed by LOCal Oxidation of exposed Silicon, commonly known as LOCOS. One approach in forming such oxide is to cover the active regions with a layer of silicon nitride that prevents oxidation from occurring therebeneath. A thin intervening layer of a sacrificial pad oxide is provided intermediate the silicon substrate and nitride layer to alleviate stress and protect the substrate from damage during subsequent removal of the nitride layer. The unmasked or exposed field regions of the substrate are then subjected to a wet $H_2O$ oxidation, typically at atmospheric pressure and at temperatures of around 1000° C., for two to four hours. This results in field oxide growth where there is no masking nitride.

However at the edges of the nitride, some oxidant also diffuses laterally. This causes the oxide to grow under and lift the nitride edges. Because the shape of the oxide at the nitride edges is that of a slowly tapering oxide wedge that merges into another previously formed layer of oxide, it has commonly been referred to as a "bird's beak". The bird's beak is a lateral extension or encroachment of the field oxide into the active areas where the devices are formed. Although the length of the bird's beak depends upon a number of parameters, the length is typically from 0.05 micron–0.15 micron per side.

This thinner area of oxide resulting from the bird's beak provides the disadvantage of not providing effective isolation in these regions, and as well unnecessarily consumes precious real estate on the semiconductor wafer. Further, as circuit density commonly referred to as device pitch falls below 1.0 micron, conventional LOCOS techniques fail due to excessive encroachment of the oxide beneath the masking stack. The closeness of the masking block stacks in such instances can result in effective joining of adjacent bird's beaks, thus effectively lifting the masking stacks and resulting in no masking effect to the oxidation.

Also, considerable undesirable stresses are created beneath the nitride at the silicon interface when oxidation occurs. These stresses are in large part due to the formed $SiO_2$ consuming 2.4 times the volume as elemental silicon it replaces. The pad oxide layer absorbs some of this stress, but additional techniques have been utilized. One such technique used to further alleviate the stress during LOCOS is to use a thin layer of polysilicon which is interposed between the pad oxide layer and the overlying nitride. The goal is to have some of the stress, which would otherwise be subjected upon the silicon substrate, occur in the deposited polysilicon layer. A significant problem, however, is that the polysilicon at the edges of the nitride mask will itself oxidize, forming $SiO_2$ which is the same composition as the field oxide regions. Such oxidized polysilicon regions are not practically removable, and undesirably result in increased volume of oxide in the bird's beak regions.

The SILO (sealed-interface local oxidation) process is another modification of typical prior art LOCOS processes. In SILO, a thin layer of silicon nitride is formed on the silicon surface. A pad oxide layer ($SiO_2$) and a nitride film are subsequently deposited. This three layer composite is then photopatterned and etched to overlie desired active area regions and leave desired field oxide regions exposed. The nitride layer is intended to seal an interface between it and the silicon substrate surface to restrict lateral diffusion of oxidants during LOCOS, and thus reduce bird's beak encroachment.

It would be desirable to develop alternate techniques.

BRIEF DESCRIPTION OF THE DRAWINGS

Preferred embodiments of the invention are described below with reference to the following accompanying drawings.

FIG. 7 is a view of the FIG. 1 wafer fragment at a processing step subsequent to that shown by FIG. 6.

FIG. 8 is a diagrammatic sectional view of a semiconductor wafer fragment alternate to the FIGS. 1–7 embodiment, shown in sequence at an alternate processing step to that shown by FIG. 6.

FIG. 9 is a view of the FIG. 8 wafer fragment at a processing step subsequent to that shown by FIG. 8.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of forming field isolation oxide relative to a semiconductor substrate comprises:

masking a first portion of a semiconductor substrate with a composite comprising a first nitride layer, a polysilicon layer over the nitride layer, and a second nitride layer over the polysilicon layer; and leaving a second portion of the semiconductor substrate unmasked by said composite; and exposing the semiconductor substrate to oxidizing conditions effective to form field isolation oxide in the second substrate portion.

In accordance with another aspect of the invention, a semiconductor processing method of forming field isolation oxide relative to a silicon substrate comprises:

rapid thermal nitridizing an exposed silicon substrate surface to form a base silicon nitride layer on the silicon substrate;

providing a silicon nitride masking layer over the nitride base layer, the base and masking silicon nitride layers comprising a composite of said layers of a combined thickness effective to restrict appreciable oxidation of silicon substrate thereunder when the substrate is exposed to LOCOS conditions; and exposing the substrate to oxidizing conditions effective to form field isolation oxide on substrate areas not masked by the base and masking silicon nitride layers composite.

Further, a polybuffered LOCOS process comprises providing a silicon nitride layer intermediate a silicon substrate and a polysilicon layer prior to oxidizing exposed portions of the silicon substrate.

Figure 1:
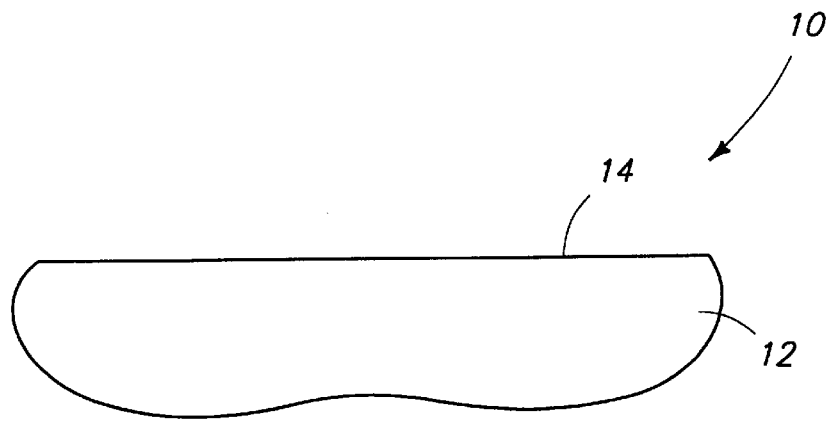
FIG. 1 is a diagrammatic sectional view of a semiconductor wafer fragment at one processing step in accordance with the invention.

FIG. 1 illustrates a semiconductor wafer fragment in process generally with numeral 10 in a method of forming field isolation oxide relative thereto. Substrate 10 is preferably comprised of a bulk monocrystalline silicon substrate 12, and includes an outer exposed surface 14.

Figure 2:
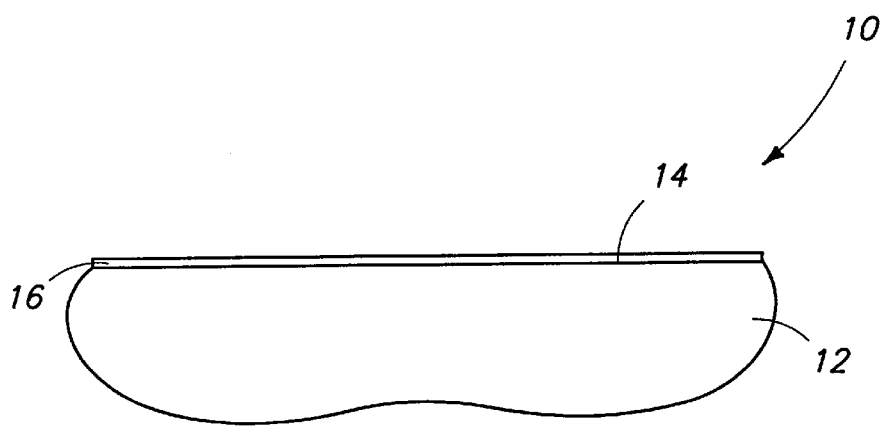
FIG. 2 is a view of the FIG. 1 wafer fragment at a processing step subsequent to that shown by FIG. 1.

Referring to FIG. 2, exposed surface 14 is preferably subjected to wet HF cleaning to remove oxide or other impurities therefrom. Immediately thereafter, such is subjected to rapid thermal nitridation to form a base silicon nitride layer 16 of a preferred thickness from about 10 Angstroms to about 50 Angstroms on exposed surface 14. More preferably, base silicon nitride layer 16 is provided to a thickness of less than or equal to about 25 Angstroms, such as from about 15 Angstroms to about 20 Angstroms. An example process to produce layer 16 by rapid thermal nitridation is to expose wafer 12 to either $NH_3$ and/or $N_2$ in a rapid thermal processor at a temperature of from about 800° C. to about 900° C. Silicon material of substrate 12 effectively reacts with nitrogen of the $NH_3$ or $N_2$ to produce $Si_3N_4$ layer 16.

Figure 3:
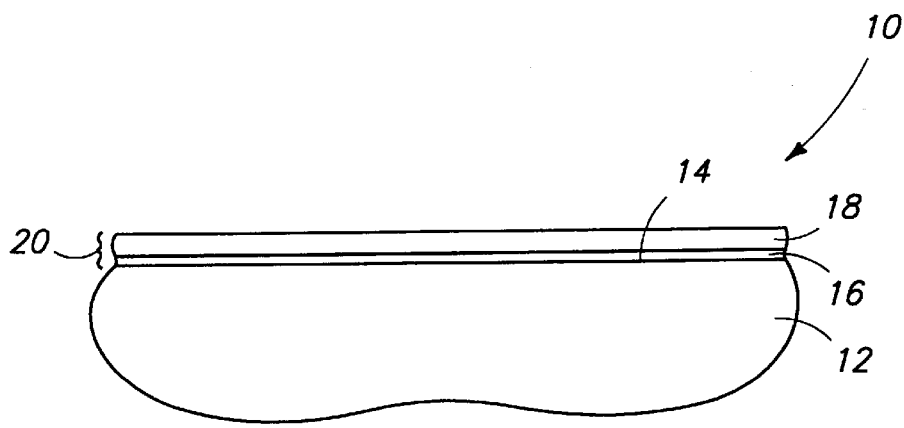
FIG. 3 is a view of the FIG. 1 wafer fragment at a processing step subsequent to that shown by FIG. 2.

Referring to FIG. 3, an overlying nitride layer 18 is deposited, most preferably by low pressure chemical vapor deposition, onto rapid thermal base layer 16 to a preferred thickness of from about 100 Angstroms to about 300 Angstroms. An exemplary thickness is 200 Angstroms. Layers 16 and 18 in combination comprise a composite first nitride layer 20 essentially formed of two separately provided nitride layers. Most preferably, the thickness of first nitride layer 20 is at least about 100 Angstroms. Thus in the illustrated and preferred embodiment, first nitride layer 20 is provided in physical contacting relationship with semiconductor substrate 12, with nitride layer 16 being provided directly on substrate 12, and nitride layer 18 being provided over substrate 12 and on and over rapid thermal nitride base layer 16. Layer 18 can be provided by conventional or other techniques.

Figure 4:
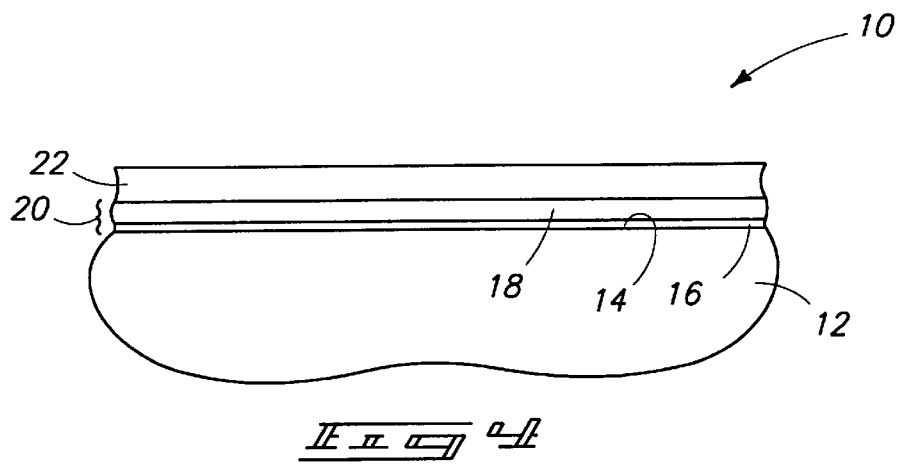
FIG. 4 is a view of the FIG. 1 wafer fragment at a processing step subsequent to that shown by FIG. 3.

Referring to FIG. 4, a polysilicon layer 22 is provided, such as by chemical vapor deposition, on and over silicon nitride layer 18 to a preferred thickness of at least about 200 Angstroms. A thickness of 500 Angstroms is exemplary.

Figure 5:
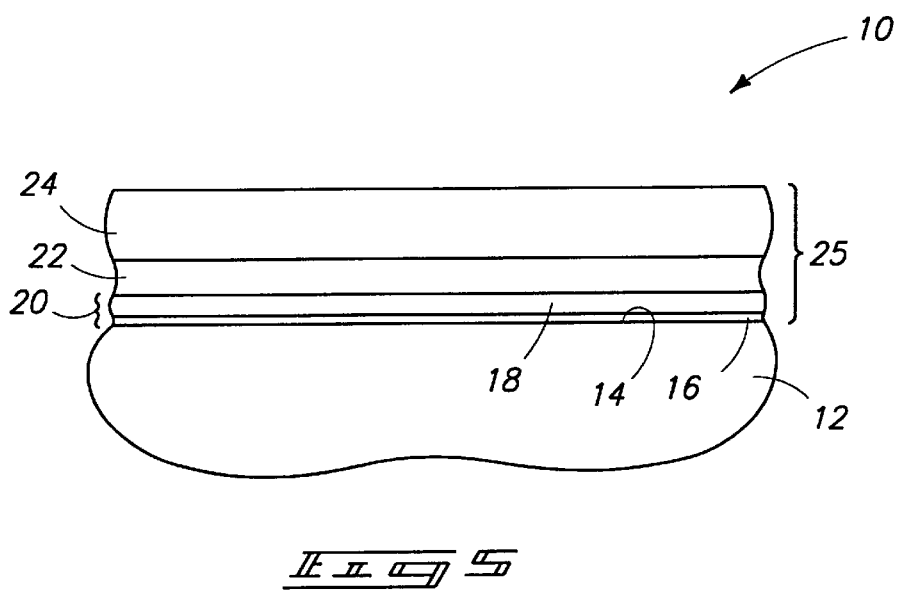
FIG. 5 is a view of the FIG. 1 wafer fragment at a processing step subsequent to that shown by FIG. 4.

Referring to FIG. 5, a silicon nitride masking layer 24 is provided, such as by low pressure chemical vapor deposition, on and over polysilicon layer 22 to a preferred thickness of at least about 1500 Angstroms. An exemplary thickness is 2000 Angstroms. Layers 20, 22 and 24 comprise a composite 25 of said layers at a combined thickness effective to restrict appreciable oxidation of silicon substrate 12 thereunder when the illustrated wafer is exposed to LOCOS conditions. Further, polysilicon layer 22 is provided intermediate base silicon nitride layer 16 and masking silicon nitride layer 24.

Figure 6:
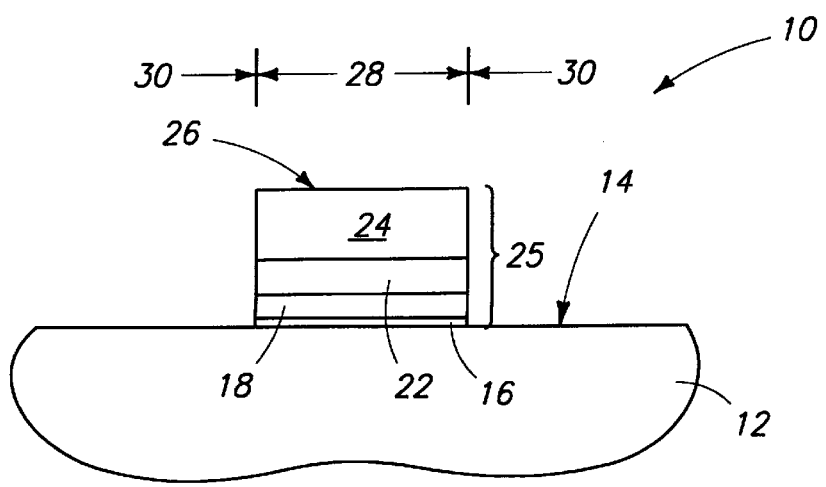
FIG. 6 is a view of the FIG. 1 wafer fragment at a processing step subsequent to that shown by FIG. 5.

Referring to FIG. 6, the wafer fragment is subjected to suitable photopatterning and reactive ion etching to produce the illustrated masking block 26 of composite layers 25. Thus, such effectively defines a first masked portion 28 of substrate 12 and second unmasked portions 30 of substrate 12. Further alternately if desired, etching can further be conducted into silicon substrate 12 such that the resultant field oxide will be recessed relative to exemplary outer surface 14 of substrate 12.

Referring to FIG. 7, wafer fragment 10 and accordingly silicon substrate 12 is exposed to suitable oxidizing conditions effective to form field isolation oxide regions 35 on substrate areas 30 not masked by masking composite layers 25. Conventional prior art LOCOS oxidation can occur, such as using example conditions of 950° C.–1000° C., $O_2$ feed at 5 slmp, $H_2$ feed at 5 slmp for 2.5 to 3 hours.

Thus in accordance with the preferred embodiment, polybuffered LOCOS is combined with SILO in a manner whereby a silicon nitride layer is provided intermediate a silicon substrate and a polysilicon layer prior to oxidizing exposed portions of the silicon substrate. No extra masks over prior art processes are required. Such processing produces less bird's beak encroachment, thereby restricting or minimizing the space required on a substrate for field isolation.

An improved silicon nitride sealing layer is created by the preferred embodiment base layer of silicon nitride provided by rapid thermal nitridation. Such provides an improved sealing layer which can function as an offset stop in preventing lateral oxidant diffusion, and thereby suppress bird's beak formation, during oxidation. The polysilicon layer releases stress from the subsequently deposited nitride layer. Accordingly and further, less silicon defects are expected relative to substrate 12 than occurs in conventional SILO processes. Dopant implanting beneath the field oxide regions will of course also typically and preferably occur to provide further isolation between substrate active area regions.

The above described process as respects rapid thermal nitridation of an exposed silicon substrate in a process not fundamentally requiring polybuffered LOCOS is also expected to have meaningful utility in SILO-like processes. Accordingly, an alternate embodiment is shown and described with reference to FIGS. 8 and 9. Like numerals from the first described embodiment are utilized where appropriate, with differences being indicated by the suffix "a" or with different numerals. Here, a rapid thermal nitridized layer 16 of a masking block 26a is covered with a nitride masking layer 24a, preferably deposited by chemical vapor deposition. Thus in this example described embodiment, there is no intervening polysilicon layer. The illustrated construction can otherwise be provided as described above with respect to the FIGS. 1–7 embodiment.

Referring to FIG. 9, the wafer is subjected to oxidation conditions effective to produce the illustrated construction. Again, the layer of nitride 16 produced by rapid thermal nitridation provides improved sealing effect and less damage to the underlying substrate than in other SILO-like processes.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A polybuffered LOCOS process, comprising:
    forming a silicon nitride layer on and physically contacting a monocrystalline silicon substrate;
    incorporating the silicon nitride layer within a polybuffered mask; and
    using the polybuffered mask to protect an underlying region of the substrate during oxidation of other regions of the substrate.

2. The polybuffered LOCOS process of claim 1 wherein the silicon nitride layer has a thickness of at least about 100 Angstroms.

3. The polybuffered LOCOS process of claim 1 wherein the silicon nitride layer comprises a composite of two separately provided nitride layers.

4. The polybuffered LOCOS process of claim 1 wherein the silicon nitride layer comprises silicon nitride provided by rapid thermal nitridation.

5. The polybuffered LOCOS process of claim 1 wherein the silicon nitride layer comprises silicon nitride provided by rapid thermal nitridation, the rapid thermal nitridized layer having a thickness of less than or equal to about 25 Angstroms.

6. The polybuffered LOCOS process of claim 1 wherein the silicon nitride layer comprises a composite of two separately provided silicon nitride layers, a first provided of said composite layers comprising silicon nitride provided by rapid thermal nitridation, a second provided of said composite layers comprising silicon nitride provided by chemical vapor deposition.

7. The polybuffered LOCOS process of claim 1 wherein the silicon nitride layer comprises a composite of two separately provided nitride layers having a combined thickness of at least about 100 Angstroms.

8. A semiconductor processing method of forming field isolation oxide relative to a monocrystalline semiconductor substrate comprising masking a portion of a monocrystalline semiconductor substrate with a composite while leaving an other portion unmasked, the composite comprising a nitride layer and a polysilicon layer over the nitride layer, the nitride layer physically contacting the monocrystalline semiconductor substrate; and
    exposing the monocrystalline semiconductor substrate to oxidizing conditions effective to form field isolation oxide in said other substrate portion.

9. The semiconductor processing method of claim 1 wherein the first nitride layer consists essentially of silicon nitride.

10. The semiconductor processing method of forming field isolation oxide of claim 8 wherein the nitride layer comprises a composite of two separately provided nitride layers.

11. The semiconductor processing method of forming field isolation oxide of claim 8 wherein the nitride layer has a thickness of at least about 100 Angstroms.

12. The semiconductor processing method of forming field isolation oxide of claim 8 wherein the nitride layer comprises a composite of two separately provided nitride layers, a first provided of said composite layers comprising silicon nitride provided by rapid thermal nitridation, a second provided of said composite layers comprising silicon nitride provided by chemical vapor deposition.

13. The semiconductor processing method of forming field isolation oxide of claim 8 wherein the nitride layer comprises a composite of two separately provided nitride layers having a combined thickness of at least about 100 Angstroms.

14. The semiconductor processing method of forming field isolation oxide of claim 8 wherein the nitride layer comprises silicon nitride provided by rapid thermal nitridation.

15. The semiconductor processing method of forming field isolation oxide of claim 8 wherein the nitride layer comprises silicon nitride provided by rapid thermal nitridation, the rapid thermal nitridized layer having a thickness of less than or equal to about 25 Angstroms.

16. The semiconductor processing method of forming field isolation oxide of claim 8 wherein the polysilicon layer is provided in physical contacting relationship with the nitride layer.

17. A semiconductor processing method of forming field isolation oxide relative to a silicon substrate comprising:
    rapid thermal nitridizing a monocrystalline silicon substrate surface to form a base silicon nitride layer on the silicon substrate, the rapid thermal nitridizing comprising exposing the silicon substrate surface to at least one of $NH_3$ or $N_2$;
    providing a silicon nitride masking layer over the nitride base layer;
    providing a polysilicon layer intermediate the base and masking silicon nitride layers prior to the exposing;
    photopatterning the nitride masking layer and base silicon nitride layer to remove the nitride masking layer and base silicon nitride layer from over a portion of the substrate surface; and
    exposing the portion of the substrate surface to oxidizing conditions effective to form field isolation oxide on the portion of the substrate surface.

18. The semiconductor processing method of forming field isolation oxide of claim 17 further comprising providing a chemical vapor deposited silicon nitride layer over the base layer prior to providing the masking layer.

19. The semiconductor processing method of forming field isolation oxide of claim 17 further comprising providing a polysilicon layer intermediate the base and masking silicon nitride layers prior to the exposing; and
    providing a chemical vapor deposited silicon nitride layer over the base layer prior to providing the masking layer.

20. A semiconductor processing method of forming field isolation oxide relative to a silicon substrate comprising:
    cleaning an exposed monocrystalline silicon substrate surface;
    rapid thermal nitridizing the exposed and cleaned silicon substrate surface to form a base silicon nitride layer of at a thickness of from about 10 Angstroms to about 50 Angstroms on the silicon substrate;
    chemical vapor depositing a silicon nitride layer on the rapid thermal base layer to a thickness of from about 100 Angstroms to about 300 Angstroms;

providing a polysilicon layer on the chemical vapor deposited silicon nitride layer to a thickness of at least about 200 Angstroms;

providing a silicon nitride masking layer on the polysilicon layer to a thickness of at least about 1500 Angstroms; the rapid thermal base, the chemical vapor deposited, the polysilicon and masking layers comprising a composite of said layers;

photopatterning the composite of the layers to remove the composite from over a portion of the substrate surface; and exposing the substrate to oxidizing conditions effective to form field isolation oxide on the portions of the substrate surface.

21. The semiconductor processing method of claim 20 wherein the rapid thermal nitridizing comprises exposing the silicon substrate surface to at least one of $NH_3$ or $N_2$.

22. A semiconductor process, comprising:

forming a first silicon nitride material on and physically contacting a monocrystalline silicon substrate; and forming a layer of polysilicon on the first silicon nitride material.

23. The method of claim 22 wherein the forming the first silicon nitride material comprises:

rapid thermal nitridation of the monocrystalline silicon substrate to form an initial silicon nitride layer; and chemical vapor deposition of silicon nitride on the initial silicon nitride layer.

24. A semiconductor process, comprising:

forming a first silicon nitride material on and physically contacting a monocrystalline silicon substrate;

forming a layer of polysilicon on the first silicon nitride material; and patterning the first silicon nitride material and polysilicon layer together to form a mask comprising the first silicon nitride material and polysilicon layer.

25. The method of claim 24 wherein the forming the first silicon nitride material comprises:

rapid thermal nitridation of the monocrystalline silicon substrate to form an initial silicon nitride layer; and chemical vapor deposition of silicon nitride on the initial silicon nitride layer.

26. A semiconductor process, comprising:

forming a first silicon nitride material on and physically contacting a monocrystalline silicon substrate;

forming a layer of polysilicon on the first silicon nitride material;

forming a second silicon nitride material on the layer of polysilicon; and patterning the first silicon nitride material, polysilicon layer, and second silicon nitride material together to form a mask comprising the first silicon nitride material, polysilicon layer, and second silicon nitride material.

27. The method of claim 26 wherein the forming the first silicon nitride material comprises:

rapid thermal nitridation of the monocrystalline silicon substrate to form an initial silicon nitride layer; and chemical vapor deposition of silicon nitride on the initial silicon nitride layer.

* * * * *